(12) United States Patent
Xia et al.

(10) Patent No.: US 8,819,527 B2
(45) Date of Patent: Aug. 26, 2014

(54) SYSTEMS AND METHODS FOR MITIGATING STUBBORN ERRORS IN A DATA PROCESSING SYSTEM

(75) Inventors: Haitao Xia, San Jose, CA (US); Wu Chang, Santa Clara, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 339 days.

(21) Appl. No.: 13/186,234

(22) Filed: Jul. 19, 2011

(65) Prior Publication Data

US 2013/0024740 A1 Jan. 24, 2013

(51) Int. Cl.
*H03M 13/03* (2006.01)
*H03M 13/11* (2006.01)
*H03M 13/15* (2006.01)
*H03M 13/29* (2006.01)
*H03M 13/37* (2006.01)
*H03M 13/41* (2006.01)
*H03M 13/39* (2006.01)
*H03M 13/45* (2006.01)
*H03M 13/00* (2006.01)

(52) U.S. Cl.
CPC ...... *H03M 13/1102* (2013.01); *H03M 13/1515* (2013.01); *H03M 13/2957* (2013.01); *H03M 13/3746* (2013.01); *H03M 13/41* (2013.01); *H03M 13/42* (2013.01); *H03M 13/451* (2013.01); *H03M 13/458* (2013.01); *H03M 13/6331* (2013.01)
USPC ............................. 714/780; 714/758; 714/746

(58) Field of Classification Search
CPC ..................... H03M 13/1102; H03M 13/1515; H03M 13/2957; H03M 13/3746; H03M 13/41; H03M 13/451; H03M 13/42; H03M 13/458; H03M 13/6331

USPC ................................. 714/728, 738, 758, 780
See application file for complete search history.

(56) References Cited

U.S. PATENT DOCUMENTS 5,278,703 A 1/1994 Rub
5,278,846 A 1/1994 Okayama et al.
(Continued)

FOREIGN PATENT DOCUMENTS

EP 0522578 1/1993
EP 0631277 12/1994
(Continued)

OTHER PUBLICATIONS

Yunxiang Wu; O'Sullivan, J.A.; Singla, N.; Indeck, R.S., "Iterative detection and decoding for separable two-dimensional intersymbol interference," Magnetics, IEEE Transactions on , vol. 39, No. 4, pp. 2115,2120, Jul. 2003.*

(Continued)

*Primary Examiner* — Cynthia Britt
(74) *Attorney, Agent, or Firm* — Hamilton DeSanctis & Cha

(57) ABSTRACT

Various embodiments of the present invention provide data processing circuits that include: a data detector circuit, a data decoder circuit, and a modification circuit. The data detector circuit is operable to apply a data detection algorithm to a data input to yield a detected output. The data decoder circuit is operable to apply a data decode algorithm to a decode input to yield a decoded output. The decode input is selected between at least the detected output, and a modified version of the detected output. The modification circuit is operable to receive the detected output and to provide the modified version of the detected output.

20 Claims, 3 Drawing Sheets

(56) References Cited

U.S. PATENT DOCUMENTS

| | | | |
|---|---|---|---|
| 5,325,402 A | 6/1994 | Ushirokawa | |
| 5,392,299 A | 2/1995 | Rhines et al. | |
| 5,471,500 A | 11/1995 | Blaker et al. | |
| 5,513,192 A | 4/1996 | Janku et al. | |
| 5,523,903 A | 6/1996 | Hetzler | |
| 5,550,870 A | 8/1996 | Blaker et al. | |
| 5,612,964 A | 3/1997 | Haraszti | |
| 5,701,314 A | 12/1997 | Armstrong et al. | |
| 5,710,784 A | 1/1998 | Kindred et al. | |
| 5,712,861 A | 1/1998 | Inoue et al. | |
| 5,717,706 A | 2/1998 | Ikeda | |
| 5,768,044 A | 6/1998 | Hetzler | |
| 5,802,118 A | 9/1998 | Bliss et al. | |
| 5,844,945 A | 12/1998 | Nam et al. | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister et al. | |
| 6,009,552 A * | 12/1999 | Ariel et al. | 714/780 |
| 6,023,783 A | 2/2000 | Divsalar et al. | |
| 6,029,264 A | 2/2000 | Kobayashi et al. | |
| 6,041,432 A | 3/2000 | Ikeda | |
| 6,065,149 A | 5/2000 | Yamanaka | |
| 6,097,764 A | 8/2000 | McCallister et al. | |
| 6,145,110 A | 11/2000 | Khayrallah | |
| 6,216,249 B1 | 4/2001 | Bliss et al. | |
| 6,216,251 B1 | 4/2001 | McGinn | |
| 6,229,467 B1 | 5/2001 | Eklund et al. | |
| 6,249,461 B1 | 6/2001 | Choi et al. | |
| 6,266,795 B1 | 7/2001 | Wei | |
| 6,317,472 B1 | 11/2001 | Choi et al. | |
| 6,351,832 B1 | 2/2002 | Wei | |
| 6,377,610 B1 | 4/2002 | Hagenauer et al. | |
| 6,381,726 B1 | 4/2002 | Weng | |
| 6,438,717 B1 | 8/2002 | Butler et al. | |
| 6,473,878 B1 | 10/2002 | Wei | |
| 6,476,989 B1 | 11/2002 | Chainer et al. | |
| 6,625,775 B1 | 9/2003 | Kim | |
| 6,657,803 B1 | 12/2003 | Ling et al. | |
| 6,671,404 B1 | 12/2003 | Katawani et al. | |
| 6,748,034 B2 | 6/2004 | Hattori et al. | |
| 6,757,862 B1 | 6/2004 | Marianetti, II | |
| 6,785,863 B2 | 8/2004 | Blankenship et al. | |
| 6,788,654 B1 | 9/2004 | Hashimoto et al. | |
| 6,810,502 B2 | 10/2004 | Eidson | |
| 6,980,382 B2 | 12/2005 | Hirano et al. | |
| 6,986,098 B2 | 1/2006 | Poeppelman | |
| 7,010,051 B2 | 3/2006 | Murayama et al. | |
| 7,047,474 B2 | 5/2006 | Rhee et al. | |
| 7,058,873 B2 | 6/2006 | Song et al. | |
| 7,073,118 B2 | 7/2006 | Greenberg et al. | |
| 7,093,179 B2 | 8/2006 | Shea | |
| 7,113,356 B1 | 9/2006 | Wu | |
| 7,136,244 B1 | 11/2006 | Rothbert | |
| 7,173,783 B1 | 2/2007 | McEwen et al. | |
| 7,184,486 B1 | 2/2007 | Wu et al. | |
| 7,191,378 B2 | 3/2007 | Eroz et al. | |
| 7,203,015 B2 | 4/2007 | Sakai et al. | |
| 7,203,887 B2 | 4/2007 | Eroz et al. | |
| 7,236,757 B2 | 6/2007 | Raghaven et al. | |
| 7,257,764 B2 | 8/2007 | Suzuki et al. | |
| 7,310,768 B2 | 12/2007 | Eidson et al. | |
| 7,313,750 B1 | 12/2007 | Feng et al. | |
| 7,370,258 B2 | 5/2008 | Iancu et al. | |
| 7,403,752 B2 | 7/2008 | Raghaven et al. | |
| 7,430,256 B2 | 9/2008 | Zhidkov | |
| 7,502,189 B2 | 3/2009 | Sawaguchi et al. | |
| 7,505,537 B1 | 3/2009 | Sutardja | |
| 7,523,375 B2 | 4/2009 | Spencer | |
| 7,587,657 B2 | 9/2009 | Haratsch | |
| 7,589,858 B2 | 9/2009 | Shin et al. | |
| 7,590,168 B2 | 9/2009 | Raghaven et al. | |
| 7,702,989 B2 | 4/2010 | Graef et al. | |
| 7,712,008 B2 | 5/2010 | Song et al. | |
| 7,738,201 B2 | 6/2010 | Jin et al. | |
| 7,752,523 B1 | 7/2010 | Chaichanavong | |
| 7,801,200 B2 | 9/2010 | Tan | |
| 7,802,163 B2 | 9/2010 | Tan | |
| 2003/0063405 A1 | 4/2003 | Jin et al. | |
| 2003/0081693 A1 | 5/2003 | Raghaven et al. | |
| 2003/0087634 A1 | 5/2003 | Raghaven et al. | |
| 2003/0112896 A1 | 6/2003 | Raghaven et al. | |
| 2003/0134607 A1 | 7/2003 | Raghaven et al. | |
| 2004/0071206 A1 | 4/2004 | Takatsu | |
| 2004/0098659 A1 | 5/2004 | Bjerke et al. | |
| 2005/0010855 A1 | 1/2005 | Lusky | |
| 2005/0078399 A1 | 4/2005 | Fung | |
| 2005/0111540 A1 | 5/2005 | Modrie et al. | |
| 2005/0157780 A1 | 7/2005 | Werner et al. | |
| 2005/0195749 A1 | 9/2005 | Elmasry et al. | |
| 2005/0216819 A1 | 9/2005 | Chugg et al. | |
| 2005/0273688 A1 | 12/2005 | Argon | |
| 2006/0020872 A1 | 1/2006 | Richardson et al. | |
| 2006/0031737 A1 | 2/2006 | Chugg et al. | |
| 2006/0123285 A1 | 6/2006 | De Araujo et al. | |
| 2006/0140311 A1 | 6/2006 | Ashley et al. | |
| 2006/0168493 A1 | 7/2006 | Song et al. | |
| 2006/0195772 A1 | 8/2006 | Graef et al. | |
| 2006/0210002 A1 | 9/2006 | Yang et al. | |
| 2006/0248435 A1 | 11/2006 | Haratsch | |
| 2006/0256670 A1 | 11/2006 | Park et al. | |
| 2007/0011569 A1 | 1/2007 | Casado et al. | |
| 2007/0047121 A1 | 3/2007 | Elefeheriou et al. | |
| 2007/0047635 A1 | 3/2007 | Stojanovic et al. | |
| 2007/0110200 A1 | 5/2007 | Mergen et al. | |
| 2007/0230407 A1 | 10/2007 | Petrie et al. | |
| 2007/0286270 A1 | 12/2007 | Huang et al. | |
| 2008/0049825 A1 | 2/2008 | Chen et al. | |
| 2008/0055122 A1 | 3/2008 | Tan | |
| 2008/0065970 A1 | 3/2008 | Tan | |
| 2008/0069373 A1 | 3/2008 | Jiang et al. | |
| 2008/0168330 A1 | 7/2008 | Graef et al. | |
| 2008/0276156 A1 | 11/2008 | Gunnam | |
| 2008/0301521 A1 | 12/2008 | Gunnam | |
| 2009/0185643 A1 | 7/2009 | Fitzpatrick | |
| 2009/0199071 A1 | 8/2009 | Graef | |
| 2009/0235116 A1 | 9/2009 | Tan et al. | |
| 2009/0235146 A1 | 9/2009 | Tan | |
| 2009/0259915 A1 | 10/2009 | Livshitz et al. | |
| 2009/0273492 A1 | 11/2009 | Yang et al. | |
| 2009/0274247 A1 | 11/2009 | Galbraith et al. | |
| 2010/0002795 A1 | 1/2010 | Raghaven et al. | |
| 2010/0042877 A1 | 2/2010 | Tan | |
| 2010/0042890 A1 | 2/2010 | Gunam | |
| 2010/0050043 A1 | 2/2010 | Savin | |
| 2010/0061492 A1 | 3/2010 | Noeldner | |
| 2010/0070837 A1 | 3/2010 | Xu et al. | |
| 2010/0164764 A1 | 7/2010 | Nayak | |
| 2010/0185914 A1 | 7/2010 | Tan et al. | |
| 2010/0281347 A1 * | 11/2010 | Derras | 714/794 |
| 2011/0075569 A1 | 3/2011 | Marrow et al. | |
| 2011/0080211 A1 | 4/2011 | Yang et al. | |
| 2011/0167246 A1 | 7/2011 | Yang et al. | |
| 2012/0005551 A1 * | 1/2012 | Gunnam | 714/752 |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | 2010/101578 | 9/2010 |
| WO | WO 2010/101578 | 9/2010 |

OTHER PUBLICATIONS

U.S. Appl. No. 11/461,026, filed Jul. 31, 2006, Tan, Weijun.
U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.

(56) References Cited

OTHER PUBLICATIONS

U.S. Appl. No. 12/792,555, filed Jun. 2, 2010, Liu, et al.
U.S. Appl. No. 12/887,317, filed Sep. 21, 2010, Xia, et al.
U.S. Appl. No. 12/887,330, filed Sep. 21, 2010, Zhang, et al.
U.S. Appl. No. 12/887,369, filed Sep. 21, 2010, Liu, et al.
U.S. Appl. No. 12/901,816, filed Oct. 11, 2010, Li, et al.
U.S. Appl. No. 12/901,742, filed Oct. 11, 2010, Yang.
U.S. Appl. No. 12/917,756, filed Nov. 2, 2010, Miladinovic, et al.
U.S. Appl. No. 12/947,931, filed Nov. 17, 2010, Yang, Shaohua.
U.S. Appl. No. 12/947,947, filed Nov. 17, 2010, Ivkovic, et al.
U.S. Appl. No. 12/972,942, filed Dec. 20, 2010, Liao, et al.
U.S. Appl. No. 12/992,948, filed Nov. 16, 2010, Yang, et al.
U.S. Appl. No. 13/021,814, filed Feb. 7, 2011, Jin, Ming, et al.
U.S. Appl. No. 13/031,818, filed Feb. 22, 2011, Xu, Changyou, et al.
U.S. Appl. No. 13/050,129, filed Mar. 17, 2011, Tan, et al.
U.S. Appl. No. 13/050,765, filed Mar. 17, 2011, Yang, et al.
U.S. Appl. No. 13/088,119, filed Apr. 15, 2011, Zhang, et al.
U.S. Appl. No. 13/088,146, filed Apr. 15, 2011, Li, et al.
U.S. Appl. No. 13/088,178, filed Apr. 15, 2011, Sun, et al.
U.S. Appl. No. 13/126,748, filed Apr. 28, 2011, Tan.
U.S. Appl. No. 13/167,764, filed Jun. 24, 2011, Li, Zongwang, et al.
U.S. Appl. No. 13/167,771, filed Jun. 24, 2011, Li, Zongwang, et al.
U.S. Appl. No. 13/167,775, filed Jun. 24, 2011, Li, Zongwang.
U.S. Appl. No. 13/186,146, filed Jul. 19, 2011, Mathew, et al.
U.S. Appl. No. 13/186,213, filed Jul. 19, 2011, Mathew, et al.
U.S. Appl. No. 13/186,234, filed Jul. 19, 2011, Xia, Haitao, et al.
U.S. Appl. No. 13/186,251, filed Jul. 19, 2011, Xia, Haitao, et al.
U.S. Appl. No. 13/186,174, filed Jul. 19, 2011, Mathew, et al.
U.S. Appl. No. 13/186,197, filed Jul. 19, 2011, Mathew, George et al.
U.S. Appl. No. 13/213,751, filed Aug. 19, 2011, Zhang, Fan, et al.
U.S. Appl. No. 13/213,808, filed Aug. 19, 2011, Jin, Ming.
U.S. Appl. No. 13/220,142, filed Aug. 29, 2011, Chang, Wu, et al.
U.S. Appl. No. 13/227,538, filed Sep. 8, 2011, Yang, Shaohua, et al.
U.S. Appl. No. 13/227,544, filed Sep. 8, 2011, Yang, Shaohua, et al.
U.S. Appl. No. 13/239,683, filed Sep. 22, 2011, Xu, Changyou.
U.S. Appl. No. 13/239,719, filed Sep. 22, 2011, Xia, Haitao, et al.
U.S. Appl. No. 13/251,342, filed Oct. 2, 2011, Xia, Haitao, et al.
U.S. Appl. No. 13/269,832, filed Oct. 10, 2011, Xia, Haitao, et al.
U.S. Appl. No. 13/269,852, filed Oct. 10, 2011, Xia, Haitao, et al.
U.S. Appl. No. 13/284,819, filed Oct. 28, 2011, Tan, Weijun, et al.
U.S. Appl. No. 13/284,730, filed Oct. 28, 2011, Zhang, Fan, et al.
U.S. Appl. No. 13/284,754, filed Oct. 28, 2011, Zhang, Fan, et al.
U.S. Appl. No. 13/284,767, filed Oct. 28, 2011, Zhang, Fan, et al.
U.S. Appl. No. 13/284,826, filed Oct. 28, 2011, Tan, Weijun, et al.
U.S. Appl. No. 13/295,150, filed Nov. 14, 2011, Li, Zongwang, et al.
U.S. Appl. No. 13/295,160, filed Nov. 14, 2011, Li, Zongwang, et al.
U.S. Appl. No. 13/251,340, filed Oct. 3, 2011, Xia, Haitao, et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low-denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System Architectures: Synergies with Solid-State Disks" Carnegie Mellon Univ. May 1, 2009.

K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Lin et al "An efficient VLSI Architecture for non binary LDPC decoders"—IEEE Transaction on Circuits and Systems II vol. 57, Issue 1 (Jan. 2010) pp. 51-55.
Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center Ny, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matirx in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. on Circuits, Regular Papers, vol. 5, No. 4, pp. 766-775, Apr. 2005.

(56) References Cited

OTHER PUBLICATIONS

Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Iterative MAX-LOG-MAP and LDPC Detector/Decoder Hardware Implementation for Magnetic Read Channel", SRC TECHRON, pp. 1-4, Oct. 2005.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "VLSI Architecture of LDPC Based Signal Detection and Coding System for Magnetic Recording Channel", Thesis, RPI, Troy, NY, pp. 1-95, May 2006.

* cited by examiner

SYSTEMS AND METHODS FOR MITIGATING STUBBORN ERRORS IN A DATA PROCESSING SYSTEM

BACKGROUND OF THE INVENTION

The present inventions is related to systems and methods for data processing.

Various data processing circuits have been developed that include data detector and data decoder circuits. In a typical operation, a data detector circuit receives a data input and attempts to assign binary values corresponding to an original data input. In addition to assigning binary values, the data detector circuit assigns soft values indicating a degree of confidence that a data detection algorithm implemented by the data detector circuit has in the particular assigned binary value. Both the binary values and the corresponding soft values are provided to a downstream data decoder circuit where they are used to perform error correction in an attempt to recover originally written data. In some cases, stubborn patterns may be introduced to the data detector circuit where the soft value for a given binary value indicates a high degree of confidence even though the binary value has been incorrectly assigned. In some cases, remaining errors are not correctable due to the improperly indicated binary value and assigned binary value.

Hence, for at least the aforementioned reasons, there exists a need in the art for advanced systems and methods for data processing.

BRIEF SUMMARY OF THE INVENTION

The present invention is related to systems and methods for data processing.

Various embodiments of the present invention provide data processing circuits that include: a data detector circuit, a data decoder circuit, and a modification circuit. The data detector circuit is operable to apply a data detection algorithm to a data input to yield a detected output. The data decoder circuit is operable to apply a data decode algorithm to a decode input to yield a decoded output. The decode input is selected between at least the detected output, and a modified version of the detected output. The modification circuit is operable to receive the detected output and to provide the modified version of the detected output.

In some instances of the aforementioned embodiments, the modification circuit includes a comparator circuit operable to compare the detected output with a stubborn pattern. In some cases, a memory is included to store the stubborn pattern. In some cases, the comparator circuit is operable to compare hard decisions of the detected output with the stubborn pattern, and the modification circuit is operable to modify soft decisions of the detected output to yield the modified version of the detected output based at least in part on a match between the hard decisions of the detected output and the stubborn pattern. In various cases, the modification circuit further includes a processing status circuit operable to indicate a number of iterations of the data input through the data detector circuit and the data decoder circuit. In such cases, modifying the soft decisions of the detected output to yield the modified version of the detected output is further based at least in part on the number of iterations. In one or more cases, the modification circuit further includes a multiplication circuit operable to multiply the soft decisions of the detected output by a scaling factor to yield the modified version of the detected output.

Other embodiments of the present invention provide methods for data processing. The methods include: using a data detector circuit to apply a data detection algorithm to a data input to yield a detected output; using a data decoder circuit to apply a data decode algorithm to a decode input to yield a decoded output; and selecting between the detected output and a modified version of the detected output to provide as the decode input. In some cases, selecting between the detected output and the modified version of the detected output includes comparing hard decisions of the detected output with the stubborn pattern. In such cases, the modified version of the detected output is provided as the decode input based at least in part on a match between the hard decisions of the detected output and the stubborn pattern. The methods may further include programming a memory with the stubborn pattern. In one or more cases, selecting between the detected output and the modified version of the detected output further includes determining a processing status corresponding to the data decoder circuit. In such cases, the modified version of the detected output may be provided as the decode input based at least in part on the processing status. In one or more instances of the aforementioned embodiments, the methods further include multiplying soft decisions of the detected output by a scaling factor to yield the modified version of the detected output. In other instances of the aforementioned embodiments, the methods further include flipping one or more hard decisions of the detected output to yield the modified version of the detected output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
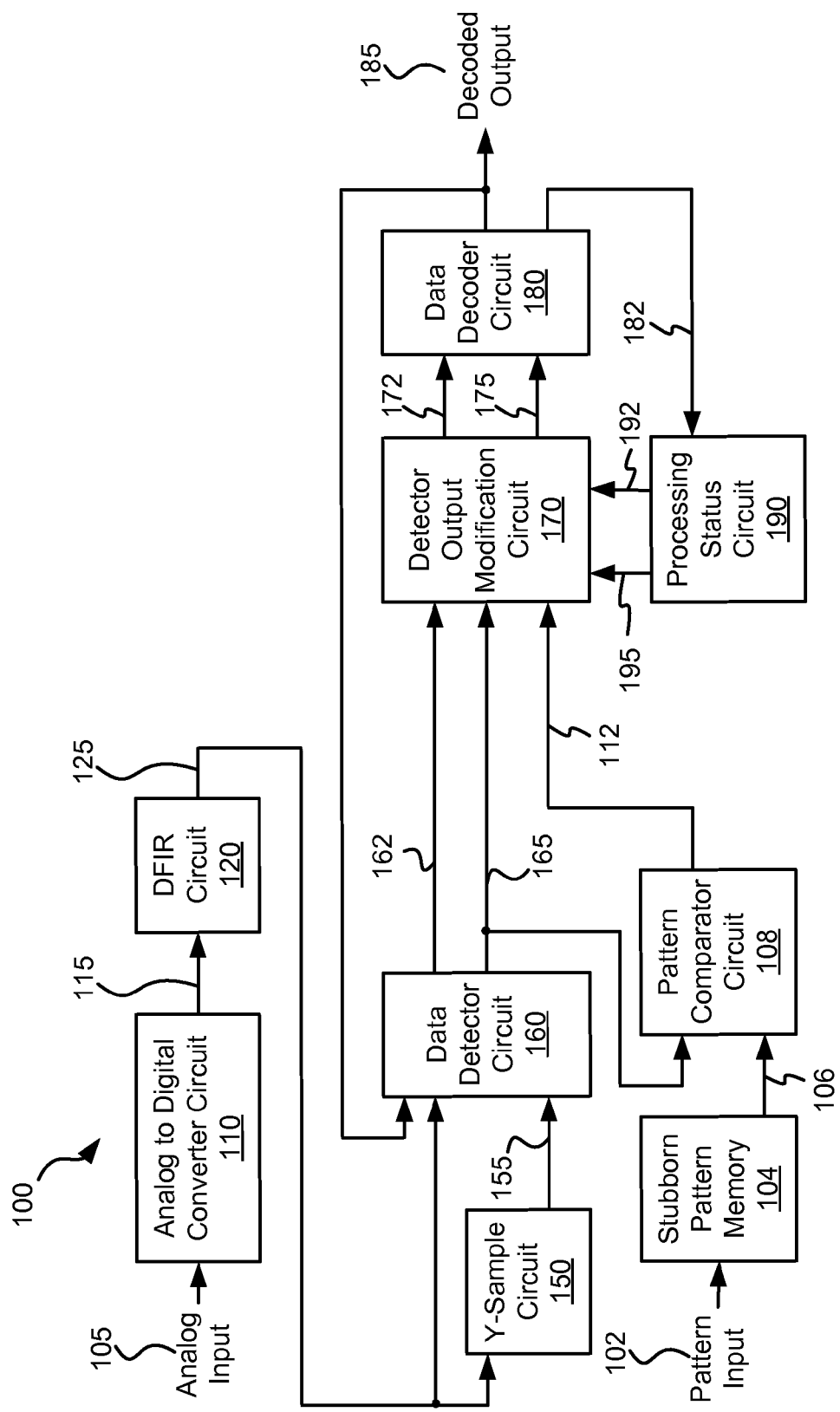
FIG. 1 depicts a data processing circuit including stubborn pattern mitigation in accordance with some embodiments of the present invention.

The present invention is related to systems and methods for data processing.

Various embodiments of the present invention provide data processing circuits designed to receive encoded data and to process the received data to recover originally written data.

The data may include various fields embedded therein that allow for, for example, synchronization to the data stream. As an example, a received data stream may include a preamble pattern, a sync mark pattern, user data, and an end of data pattern (e.g., an end of sector pad). A data detector circuit receives the encoded data which is often noise contaminated, and applies a data detection algorithm to yield both hard decisions and soft decisions. As used herein, the phrase "hard decision" is used in its broadest sense to mean any value assigned to a given bit period by a data processing circuit, and the phrase "soft decision" is used in its broadest sense to mean any indication of how likely a corresponding hard decision is correctly assigned. In some cases, the soft decisions are provided as a log likelihood ratio (LLR) calculated in accordance with the following equation:

$$LLR(x_k) = \log \frac{Pr(x_k = -1 \mid r)}{Pr(x_k = +1 \mid r)},$$

where $x_k$ is the k-th bit of data, and r is the received sample sequence. The data detector circuit may be any data detector circuit known in the art that is capable of producing both hard decisions and soft decisions including, but not limited to, a Viterbi algorithm detector circuit or a maximum a posteriori detector circuit as are known in the art. Based upon the disclosure provided herein, one of ordinary skill in the art will recognize a variety of data detector circuits that may be used in relation to different embodiments of the present invention.

A subsequent data decoder circuit uses both the hard decisions and soft decisions to correct any errors in an attempt to recover an originally written data stream. The data decoder circuit may be any data decoder circuit known in the art that is capable of applying a decoding algorithm based on both soft decisions and hard decisions. The data decoder may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention. The soft decisions from the data detector circuit play an important role in successful decoding. In general, a large value for a given soft decision means high confidence in the assigned hard decision, and a lower likelihood that the decoder circuit will modify the particular hard decision in its attempt to correct any errors. Where the soft decision indicates a high likelihood that the assigned hard decision is correct and that hard decision is correct, the data decoder circuit will converge more quickly as there are fewer hard decisions to consider for correction. However, where the soft decision indicates a high likelihood that the assigned hard decision is correct, yet that hard decision is not correct, the data decoder circuit in some cases will fail to correct remaining errors (i.e., the data will not converge).

The data processing circuits may be designed to allow multiple passes through one or both of the data detector circuit or the data decoder circuit (i.e., local iterations) before the result is provided to a subsequent processing circuit. Further, the circuits are designed to allow for the same encoded data to be processed through a combination of data detector and data decoder circuits (i.e., global iterations) before the data is passed to a subsequent processing or receiving circuit. In some cases where the combination of local and global iterations is failing to converge on the originally written data, circuitry may be used to determine whether one or more previously identified stubborn patterns occur in the encoded data. Where one or more stubborn patterns are identified, one or both of the hard decisions and the soft decisions from the data detector circuit may be modified to avoid either the stubborn pattern(s) or the effects of the stubborn pattern(s) and thereby increase the likelihood of convergence by the data decoder circuit.

Turning to FIG. 1, a data processing circuit 100 is shown that includes stubborn pattern mitigation circuitry in accordance with some embodiments of the present invention. Data processing circuit 100 includes an analog to digital conversion circuit 110 that receives an analog input 105 and provides a series of corresponding digital samples 115. Analog input 105 is derived from, for example, a storage medium or a data transmission channel. Based upon the disclosure provided herein, one of ordinary skill in the art will recognize a variety of sources of analog input 105. Analog to digital converter circuit 110 may be any circuit known in the art that is capable of converting an analog signal into a series of digital values representing the received analog signal. Digital samples 115 are provided to a digital finite impulse response circuit 120 that operates to equalize the received digitals samples 115 to yield an equalized output 125. Based upon the disclosure provided herein, one of ordinary skill in the art will recognize a variety of equalizer circuits that may be used in place of digital finite impulse response circuit 120 in accordance with different embodiments of the present invention.

Equalized output 125 is provided to both a data detector circuit 160 and a Y-sample circuit 150. Y-sample circuit 150 stores equalized output 125 as buffered data 155 for use in subsequent iterations through data detector circuit 160. Data detector circuit 160 may be any data detector circuit known in the art that is capable of producing both hard decisions 165 and soft decisions 162. As some examples, data detector circuit 160 may be, but not limited to, a Viterbi algorithm detector circuit or a maximum a posteriori detector circuit as are known in the art. Based upon the disclosure provided herein, one of ordinary skill in the art will recognize a variety of data detector circuits that may be used in relation to different embodiments of the present invention.

Both soft decisions 162 and hard decisions 165 are provided to a detector output modification circuit 170. Detector output modification circuit 170 is operable to either pass on soft decisions 162 and hard decisions 165 as soft decisions 172 and hard decisions 175, respectively, or to modify one or both of soft decisions 162 and hard decisions 165 and provide the modified data as soft decisions 172 and hard decisions 175, respectively. Whether or not soft decisions 162 and/or hard decisions 165 are modified is based upon status information (i.e., a stubborn pattern found output 112, number of global iterations 195, and number of violated checks 192) as is more fully described below. Soft decisions 172 and hard decisions 175 are provided to a data decoder circuit 180 that applies a decoding algorithm to the received input in an attempt to recover originally written data. The data decoder circuit may be any data decoder circuit known in the art that is capable of applying a decoding algorithm based on both soft decisions and hard decisions. Data decoder circuit 180 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention.

Data decoder circuit 180 provides a decoded output 185 representing the results of applying the decoding algorithm. In addition, data decoder circuit 182 provides a status output 182 indicating the results of the decoding process to a processing status circuit 190. In some cases, status output 182 indicates whether the decoding process converged (i.e., was able to correctly provide the originally written input) and an indication of the number of remaining violated checks (i.e., the number of check equations within the encoded data that were not properly resolved). Number of global iterations 195 and number of violated checks 192 are provided to detector output modification circuit 170.

In addition, a pattern comparator circuit 108 compares a stream of hard decisions 165 against one or more known stubborn patterns 106. Stubborn patterns 106 may be programmed into a stubborn pattern memory 104 via a pattern input interface 102. The programmed stubborn patterns may be identified through circuit simulation or other processes known in the art for identifying potential failures. For example, stubborn patterns may be identified as those patterns exhibiting a minimum mean squared difference from an ideal output. As one of many examples, a '11111' pattern may be identified as a stubborn pattern that is identified as a high probability of being correct, even though the actual pattern should be decoded as '11101'. Of note, the aforementioned '11111' pattern is an example only and many different stubborn patterns may be identified. Anytime the stream of hard decisions 165 matches one of stubborn patterns 106, the matched stubborn pattern is provided to detector output modification circuit 170 as stubborn pattern found output 112.

Relying on one or more of stubborn pattern found output 112, number of global iterations 195, and number of violated checks 192, detector output modification circuit 170 selects between a modified version of hard decisions 165 and soft decisions 162 or an unmodified version to be provided as hard decisions 175 and soft decisions 172. In one particular embodiment of the present invention, detector output modification circuit 170 reduces the soft decisions corresponding to hard decisions 165 included in the stream matching an identified stubborn output whenever the number of global iterations expended on the currently processing encoded data exceeds a defined threshold. The following pseudocode describes such an operation:

```
If (stubborn pattern found output 112 indicates a matched stubborn
    pattern) {
        If(number of global iterations 195 >= Threshold){
            For(i=0 to end of pattern) {
                (hard decisions 175)_i = (hard decisions 165)_i; and
                (soft decisions 172)_i = η*(soft decisions 162)_i
            }
        }
        Else {
            For(i=0 to end of pattern){
                (hard decisions 175)_i = (hard decisions 165)_i; and
                (soft decisions 172)_i = (soft decisions 162)_i
            }
        }
}
Else {
    For(i=0 to end of pattern){
        (hard decisions 175)_i = (hard decisions 165)_i; and
        (soft decisions 172)_i = (soft decisions 162)_i
    }
}
```

In such cases, η is an attenuation factor that may be either greater than one or less than one. Where η is greater than one it is expected that for the identified stubborn pattern soft decisions 162 are understated, and where η is less than one it is expected that for the identified stubborn pattern soft decisions 162 are overstated. The value of η may be programmable and used for all stubborn patterns, or each stubborn pattern may be associated with its own value of η. Of note, the modification process described above may be effectively disabled by setting η equal to one.

In other embodiments of the present invention, detector output modification circuit 170 reduces the soft decisions corresponding to hard decisions 165 included in the stream matching an identified stubborn output whenever the number of global iterations expended on the currently processing encoded data exceeds a defined threshold (ThresholdA) and the number of violated checks exceeds another threshold (ThresholdB). The following pseudocode describes such an operation:

```
If (stubborn pattern found output 112 indicates a matched stubborn
    pattern) {
        If(number of global iterations 195 >= ThresholdA &&
            number of violated checks 192 >= ThresholdB){
            For(i=0 to end of pattern) {
                (hard decisions 175)_i = (hard decisions 165)_i; and
                (soft decisions 172)_i = η*(soft decisions 162)_i
            }
        }
        Else {
            For(i=0 to end of pattern){
                (hard decisions 175)_i = (hard decisions 165)_i; and
                (soft decisions 172)_i = (soft decisions 162)_i
            }
        }
}
Else {
    For(i=0 to end of pattern){
        (hard decisions 175)_i = (hard decisions 165)_i; and
        (soft decisions 172)_i = (soft decisions 162)_i
    }
}
```

Again, in such cases, η is an attenuation factor that may be either greater than one or less than one. Where η is greater than one it is expected that for the identified stubborn pattern soft decisions 162 are understated, and where η is less than one it is expected that for the identified stubborn pattern soft decisions 162 are overstated. The value of η may be programmable and used for all stubborn patterns, or each stubborn pattern may be associated with its own value of η. Of note, the modification process described above may be effectively disabled by setting η equal to one.

In yet other embodiments of the present invention, detector output modification circuit 170 reduces the soft decisions corresponding to hard decisions 165 included in the stream matching an identified stubborn output whenever the number of global iterations expended on the currently processing encoded data exceeds a defined threshold (ThresholdA) and is less than another defined threshold (ThresholdB), and the number of violated checks exceeds another defined threshold (ThresholdC). The following pseudocode describes such an operation:

```
If (stubborn pattern found output 112 indicates a matched stubborn
    pattern) {
        If(number of global iterations 195 >= ThresholdA &&
            number of global iterations 195 < ThresholdB
            number of violated checks 192 >= ThresholdC){
            For(i=0 to end of pattern) {
                (hard decisions 175)_i = (hard decisions 165)_i; and
                (soft decisions 172)_i = η*(soft decisions 162)_i
            }
        }
        Else {
            For(i=0 to end of pattern){
```

-continued

```
            (hard decisions 175)_i = (hard decisions 165)_i; and
            (soft decisions 172)_i = (soft decisions 162)_i
        }
     }
  }
  Else {
     For(i=0 to end of pattern){
        (hard decisions 175)_i = (hard decisions 165)_i; and
        (soft decisions 172)_i = (soft decisions 162)_i
     }
  }
}
```

Again, in such cases, η is an attenuation factor that may be either greater than one or less than one. Where η is greater than one it is expected that for the identified stubborn pattern soft decisions 162 are understated, and where η is less than one it is expected that for the identified stubborn pattern soft decisions 162 are overstated. The value of η may be programmable and used for all stubborn patterns, or each stubborn pattern may be associated with its own value of η. Of note, the modification process described above may be effectively disabled by setting η equal to one.

In yet further embodiments of the present invention, detector output modification circuit 170 flips one or more of the hard decisions 165 included in the stream matching an identified stubborn output whenever the number of global iterations expended on the currently processing encoded data exceeds a defined threshold. The following pseudocode describes such an operation:

```
If (stubborn pattern found output 112 indicates a matched stubborn
pattern) {
    If(number of global iterations 195 >= Threshold){
        For(i=0 to end of pattern) {
            If(i=Switch Value){
                (hard decisions 175)_i = NOT(hard decisions 165)_i; and
                (soft decisions 172)_i = (soft decisions 162)_i
            }
            Else{
                (hard decisions 175)_i = (hard decisions 165)_i; and
                (soft decisions 172)_i = (soft decisions 162)_i
            }
        }
     }
     Else {
        For(i=0 to end of pattern){
            (hard decisions 175)_i = (hard decisions 165)_i; and
            (soft decisions 172)_i = (soft decisions 162)_i
        }
     }
}
Else {
    For(i=0 to end of pattern){
        (hard decisions 175)_i = (hard decisions 165)_i; and
        (soft decisions 172)_i = (soft decisions 162)_i
    }
}
```

It should be noted that more than one bit in a given pattern may be flipped. In addition, it should be noted that the bit flipping of hard decisions 165 may be done by multiplying a corresponding soft decision by a negative attenuation value (η). In some cases, the value of aforementioned Switch Value is a randomly selected each time a bit flipping process is performed, while in other cases the Switch Value is fixed.

Figure 2:
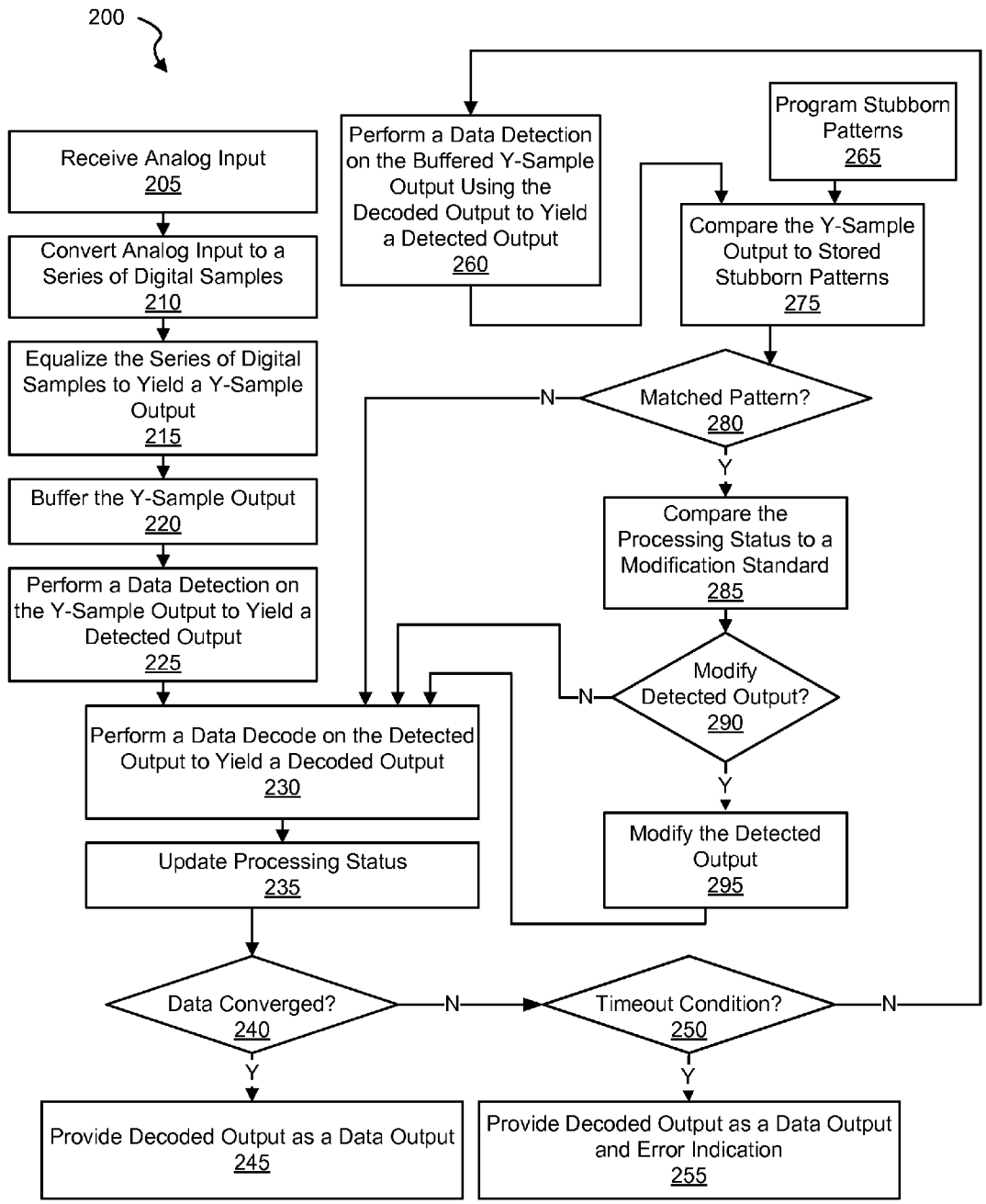
FIG. 2 is a flow diagram showing a method for stubborn pattern mitigation in accordance with various embodiments of the present invention.

Turning to FIG. 2, a flow diagram 200 shows a method for stubborn pattern mitigation in accordance with various embodiments of the present invention. Following flow diagram 200, an analog input is received (block 205). The analog input may be derived, for example, a storage medium or a data transmission channel. Based upon the disclosure provided herein, one of ordinary skill in the art will recognize a variety of sources of the analog input. The analog input is converted to a series of digital samples (block 210). This conversion may be done using an analog to digital converter circuit or system as are known in the art. Of note, any circuit known in the art that is capable of converting an analog signal into a series of digital values representing the received analog signal may be used. The resulting digital samples are equalized to yield a Y-sample output (block 215). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The resulting Y-sample output is buffered to a memory (block 220).

The Y-sample output is provided to a data detector circuit that is operable to apply a data detection algorithm to yield a detected output (block 225). As just two examples, the data detection algorithm may be a maximum a posterior data detection algorithm or a Viterbi algorithm detection as are known in the art. Based upon the disclosure provided herein, one of ordinary skill in the art will recognize a variety of data detection algorithms that may be used in relation to different embodiments of the present invention.

A data decode algorithm is then applied to the detected output to yield a decoded output (output 230). As just two examples, the data decode algorithm may be a low density parity check decode algorithm or a Reed Solomon decode algorithm as are known in the art. Based upon the disclosure provided herein, one of ordinary skill in the art will recognize a variety of data decode algorithms that may be used in relation to different embodiments of the present invention. A processing status is updated to reflect the results of applying the data decode algorithm to the detected output (block 235). This status update may include, but is not limited to, an indication of the number of global iterations (i.e., applications of the data detection algorithm and the data decode algorithm to the particular Y-sample output) and an indication of a number of violated checks (e.g., violated parity checks) that remain at the end of application of the data decode algorithm.

Based upon the updated processing status, it is determined whether the data decode algorithm converged (e.g., the number of remaining violated checks is zero or below a defined threshold) (block 240). Where the data converged (block 240), the decoded output is provided as a data output (block 245) and the processing is complete for that particular y-sample output. Alternatively, where the data failed to converge (block 240), it is determined whether a timeout condition has been met (block 250). Such a timeout condition may limit the number of global iterations that are applied to a given Y-sample output. In some cases, the number of global iterations may be variable and depend upon the rate of convergence of other Y-sample outputs concurrently processing, while in other cases the number of global iterations may be fixed. Where the timeout condition is met (block 250), the decoded output is provided as a data output along with an error indication noting that the data failed to converge (block 255).

Alternatively, where the timeout condition was not met (block 250), a process of determining whether the output of the data detection algorithm is to be modified for a subsequent global iteration. This process relies on programming one or more known stubborn patterns into a memory (block 265). The programmed stubborn patterns may be identified through circuit simulation or other processes known in the art for identifying potential failures. For example, stubborn patterns may be identified as those patterns exhibiting a minimum mean squared difference from an ideal output. As one of many examples, a '11111' pattern may be identified as a stubborn pattern that is identified as a high probability of being correct, even though the actual pattern should be decoded as '11101'. Of note, the aforementioned '11111' pattern is an example only and many different stubborn patterns may be identified.

In addition, a subsequent application of the data detection algorithm to the previously buffered y-sample output is performed using the decoded output as a guide (block 260). This process yields an updated detected output. In some cases, the applied data detection algorithm is the same as that applied during block 225 except that it is guided by soft data provided as part of the decoded output. The hard decisions from the updated detected output are compared against the previously programmed stubborn patterns (block 275). Where no matches to the previously programmed stubborn patterns are found (block 280), the processes of blocks 230-255 are repeated for the updated detected output.

Otherwise, where a match to one of the previously programmed stubborn patterns is detected (block 280), the processing status is compared against a modification standard (block 285). The modification standard is a pre-defined standard which determines whether the updated detected output is to be modified prior to subsequent application of the data decode algorithm. For example, the modification standard may indicate that a modification is to occur whenever the number of global iterations expended on the currently processing Y-samples exceeds a defined threshold. Where it is determined that the modification standard has not been met (block 290), the processes of blocks 230-255 are repeated for the updated detected output. Alternatively, where it is determined that the modification standard has been met (block 290), the updated detected output is modified (block 295). The modification may include, for example, reducing the value of the soft decisions corresponding to the updated detected output prior to performing the processes of blocks 230-255 on the modified detected output.

The following pseudocode represents the operation of blocks 280 through 295 where modification of the detected output is performed to reduce the value of thereof when the number of global iterations expended on the currently processing Y-samples exceeds a defined threshold.

```
If (stubborn pattern found output indicates a matched stubborn
pattern) {
    If(the number of global iterations >= Threshold){
        For(i=0 to end of pattern) {
            hard decisions of the detected output remain unchanged;
            and (modified soft decisions)_i = η*(soft decisions)_i
        }
    }
    Else {
        For(i=0 to end of pattern){
            hard decisions of the detected output remain unchanged;
            and soft decisions of the detected output remain unchanged
        }
    }
}
Else {
    For(i=0 to end of pattern) {
        hard decisions of the detected output remain unchanged; and
        soft decisions of the detected output remain unchanged
    }
}
```

In such cases, $\eta$ is an attenuation factor that may be either greater than one or less than one. Where $\eta$ is greater than one it is expected that for the identified stubborn pattern, the soft decisions are understated, and where $\eta$ is less than one it is expected that for the identified stubborn pattern, the soft decisions are overstated. The value of $\eta$ may be programmable and used for all stubborn patterns, or each stubborn pattern may be associated with its own value of $\eta$. Of note, the modification process described above may be effectively disabled by setting $\eta$ equal to one.

As another example, the soft decisions from the updated detected output are modified whenever the number of global iterations expended on the currently processing encoded data exceeds a defined threshold (ThresholdA) and the number of violated checks exceeds another threshold (ThresholdB). The following pseudocode describes such an operation:

```
If (stubborn pattern found output indicates a matched stubborn
pattern) {
    If(the number of global iterations >= ThresholdA &&
        the number of violated checks >= ThresholdB){
        For(i=0 to end of pattern) {
            hard decisions of the detected output remain unchanged;
            and (modified soft decisions)_i = η*(soft decisions)_i
        }
    }
    Else {
        For(i=0 to end of pattern) {
            hard decisions of the detected output remain unchanged;
            and soft decisions of the detected output remain unchanged
        }
    }
}
Else {
    For(i=0 to end of pattern) {
        hard decisions of the detected output remain unchanged; and
        soft decisions of the detected output remain unchanged
    }
}
```

As yet another example, the soft decisions corresponding to the updated detected output may be modified whenever the number of global iterations expended on the currently processing encoded data exceeds a defined threshold (ThresholdA) and is less than another defined threshold (ThresholdB), and the number of violated checks exceeds another defined threshold (ThresholdC). The following pseudocode describes such an operation:

```
If (stubborn pattern found output indicates a matched stubborn
pattern) {
    If(the number of global iterations >= ThresholdA &&
        the number of global iterations < ThresholdB
        the number of violated checks >= ThresholdC){
        For(i=0 to end of pattern) {
            hard decisions of the detected output remain unchanged;
            and (modified soft decisions)_i = η*(soft decisions)_i
        }
    }
    Else {
        For(i=0 to end of pattern) {
            hard decisions of the detected output remain unchanged;
            and soft decisions of the detected output remain unchanged
        }
    }
}
Else {
    For(i=0 to end of pattern) {
        hard decisions of the detected output remain unchanged; and
        soft decisions of the detected output remain unchanged
    }
}
```

As yet a further example, the hard decisions corresponding to the updated detected output may be modified whenever the number of global iterations expended on the currently processing encoded data exceeds a defined threshold. The following pseudocode describes such an operation:

```
If (stubborn pattern found output indicates a matched stubborn
pattern) {
    If(the number of global iterations >= Threshold){
        For(i=0 to end of pattern) {
            If(i=Switch Value){
                (modified hard decisions)_i = NOT(hard decisions)_i; and
                soft decisions of the detected output remain unchanged
            }
            Else{
                hard decisions of the detected output remain unchanged;
                and soft decisions of the detected output remain
                unchanged
            }
        }
    }
    Else {
        For(i=0 to end of pattern) {
            hard decisions of the detected output remain unchanged;
            and soft decisions of the detected output remain unchanged
        }
    }
}
Else {
    For(i=0 to end of pattern) {
        hard decisions of the detected output remain unchanged; and
        soft decisions of the detected output remain unchanged
    }
}
```

In some cases, the value of aforementioned Switch Value is a randomly selected each time a bit flipping process is performed, while in other cases the Switch Value is fixed.

Figure 3:
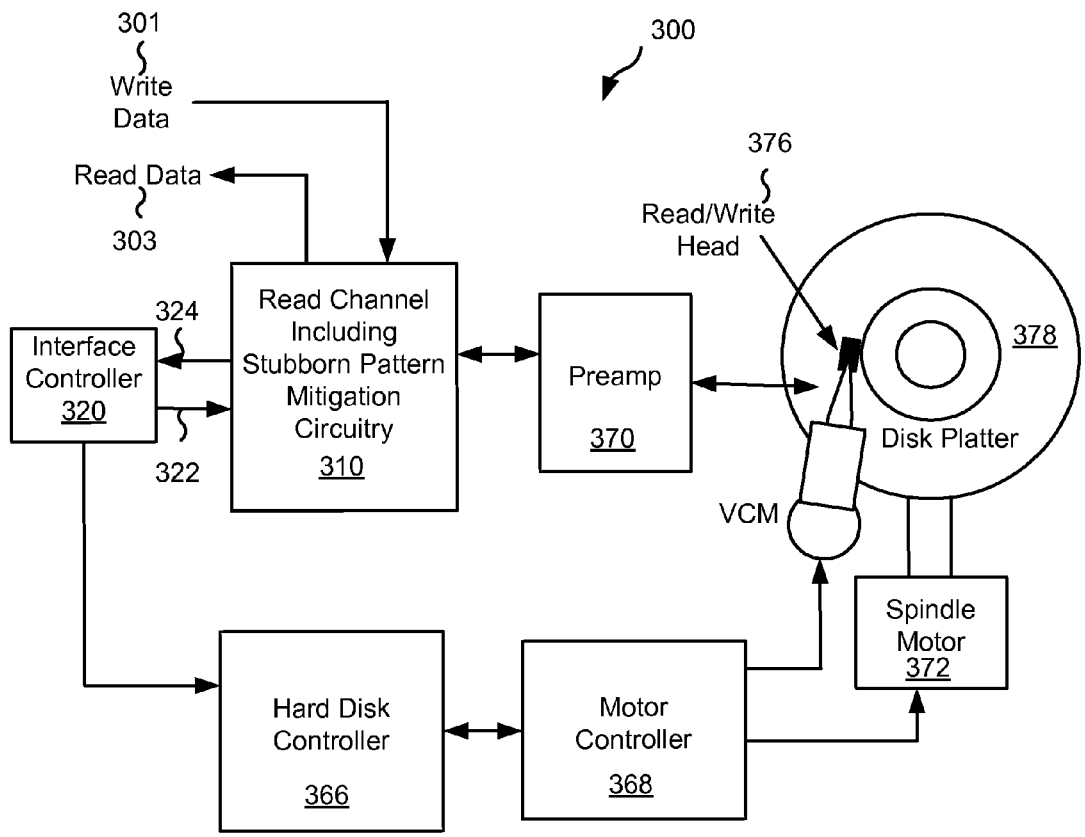
FIG. 3 shows a storage system including a read channel circuit with stubborn pattern mitigation circuitry in accordance with some embodiments of the present invention.

FIG. 3 shows a storage system 300 including a read channel circuit with stubborn pattern mitigation circuitry in accordance with some embodiments of the present invention. Storage system 300 may be, for example, a hard disk drive. Storage system 300 also includes a preamplifier 370, an interface controller 320, a hard disk controller 366, a motor controller 368, a spindle motor 372, a disk platter 378, and a read/write head assembly 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

In a typical read operation, read/write head assembly 376 is accurately positioned by motor controller 368 over a desired data track on disk platter 378. Motor controller 368 both positions read/write head assembly 376 in relation to disk platter 378 and drives spindle motor 372 by moving read/write head assembly 376 to the proper data track on disk platter 378 under the direction of hard disk controller 366. Spindle motor 372 spins disk platter 378 at a determined spin rate (RPMs). Once read/write head assembly 378 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel circuit 310 via preamplifier 370. Preamplifier 370 is operable to amplify the minute analog signals accessed from disk platter 378. In turn, read channel circuit 310 decodes and digitizes the received analog signal to recreate the information originally written to disk platter 378. This data is provided as read data 303 to a receiving circuit. As part of decoding the received information, read channel circuit 310 may apply stubborn pattern mitigation where, for example, a codeword is not converging. This stubborn pattern mitigation may be applied using data processing circuitry similar to that discussed above in relation to FIG. 1, and/or may operate similar to that discussed above in relation to FIG. 2. A write operation is substantially the opposite of the preceding read operation with write data 301 being provided to read channel circuit 310. This data is then encoded and written to disk platter 378.

It should be noted that storage system 300 may be integrated into a larger storage system such as, for example, a RAID (redundant array of inexpensive disks or redundant array of independent disks) based storage system. It should also be noted that various functions or blocks of storage system 300 may be implemented in either software or firmware, while other functions or blocks are implemented in hardware.

Figure 4:
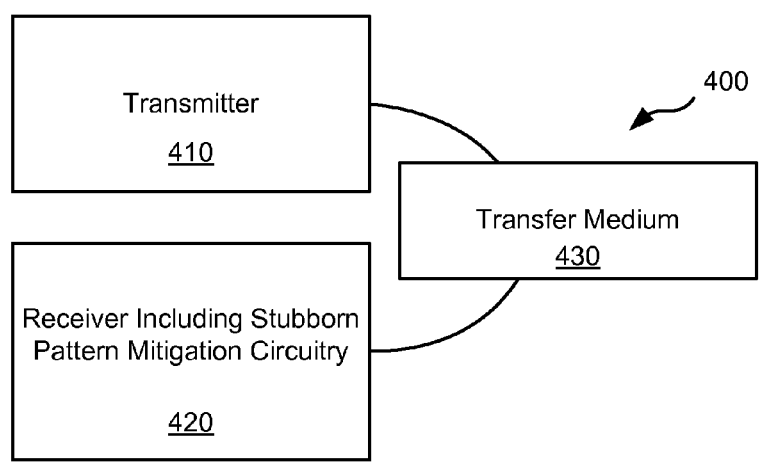
FIG. 4 depicts a wireless communication system including a receiver with stubborn pattern mitigation circuitry in accordance with some embodiments of the present invention.

Turning to FIG. 4, a wireless communication system 400 including a receiver with stubborn pattern mitigation circuitry in accordance with some embodiments of the present invention. Communication system 400 includes a transmitter 410 that is operable to transmit encoded information via a transfer medium 430 as is known in the art. The encoded data is received from transfer medium 430 by receiver 420. Receiver 420 incorporates stubborn pattern mitigation circuitry that may be implemented similar to that discussed above in relation to FIG. 1, and/or operate similar to that described above in relation to FIG. 2.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing circuit, the data processing circuit 1 comprising:
   a data detector circuit operable to apply a data detection algorithm to a data input to yield a detected output;
   a data decoder circuit operable to apply a data decode algorithm to a decode input to yield a decoded output, wherein the decode input is selectable between the detected output, and a modified version of the detected output; and a modification circuit operable to receive the detected output and to provide the modified version of the detected output, wherein the modification circuit includes a comparator circuit configured to compare the detected output with an identified pattern.

2. The data processing circuit of claim 1, wherein the data detector circuit is selected from a group consisting of: a Viterbi algorithm detector circuit, and a maximum a posteriori detector circuit.

3. The data processing circuit of claim 1, wherein the data decoder circuit is selected from a group consisting of: a low density parity check decoder circuit, and a Reed Solomon decoder circuit.

4. The data processing circuit of claim 1, wherein the data processing circuit is implemented as part of a device selected from a group consisting of: a storage device and a receiving device.

5. The data processing circuit of claim 1, wherein the data processing circuit is implemented as part of an integrated circuit.

6. The data processing circuit of claim 1, wherein the modification circuit further comprises:
a memory circuit operable to store the identified pattern.

7. The data processing circuit of claim 1, wherein the comparator circuit is operable to compare hard decisions of the detected output with the identified pattern, and wherein the modification circuit is operable to modify soft decisions of the detected output to yield the modified version of the detected output based at least in part on a match between the hard decisions of the detected output and the identified pattern.

8. The data processing circuit of claim 7, wherein the modification circuit further includes a processing status circuit operable to indicate a number of iterations of the data input through the data detector circuit and the data decoder circuit, and wherein the modifying the soft decisions of the detected output to yield the modified version of the detected output is further based at least in part on the number of iterations.

9. The data processing circuit of claim 7, wherein the modification circuit further comprises:
a multiplication circuit operable to multiply the soft decisions of the detected output by a scaling factor to yield the modified version of the detected output.

10. The data processing circuit of claim 1, wherein the comparator circuit is operable to compare hard decisions of the detected output with the identified pattern, and wherein the modification circuit is operable to modify hard decisions of the detected output to yield the modified version of the detected output based at least in part on a match between the hard decisions of the detected output and the identified pattern.

11. The data processing circuit of claim 1, wherein the data input includes both the decoded output and an equalized input, and wherein the data processing circuit further comprises:
an analog to digital converter circuit operable to sample an analog input to yield a series of digital samples; and
an equalizer circuit operable to equalize the digital samples to yield the equalized input.

12. A method for data processing, the method comprising:
using a data detector circuit to apply a data detection algorithm to a data input to yield a detected output;
using a data decoder circuit to apply a data decode algorithm to a decode input to yield a decoded output; and
selecting between the detected output and a modified version of the detected output to provide as the decode input, wherein selecting between the detected output and the modified version of the detected output includes comparing hard decisions of the detected output with an identified pattern, wherein the modified version of the detected output is provided as the decode input based at least in part on a match between the hard decisions of the detected output and the identified pattern.

13. The method of claim 12, wherein the method further comprises:
programming a memory with the identified pattern.

14. The method of claim 12, wherein selecting between the detected output and the modified version of the detected output further comprises:
determining a processing status corresponding to the data decoder circuit; and
wherein the modified version of the detected output is provided as the decode input based at least in part on the processing status.

15. The method of claim 12, wherein the method further comprises:
multiplying soft decisions of the detected output by a scaling factor to yield the modified version of the detected output.

16. The method of claim 12, wherein the method further comprises:
flipping one or more hard decisions of the detected output to yield the modified version of the detected output.

17. A storage device, the storage device comprising:
a storage medium;
a head assembly disposed in relation to the storage medium and operable to provide a sensed signal corresponding to information on the storage medium;
a read channel circuit including:
an analog processing circuit operable to provide an analog signal corresponding to the sensed signal;
an analog to digital converter circuit operable to sample the analog signal to yield a series of digital samples;
an equalizer circuit operable to equalize the digital samples to yield an equalized input;
a data detector circuit operable to apply a data detection algorithm to the equalized input to yield a detected output;
a data decoder circuit operable to apply a data decode algorithm to a decode input to yield a decoded output, wherein the decode input is selected from a group consisting of: the detected output, and a modified version of the detected output; and
a modification circuit operable to receive the detected output and to provide the modified version of the detected output.

18. The storage device of claim 17, wherein the modification circuit comprises:
a comparator circuit operable to compare hard decisions of the detected output with an identified pattern;
a memory circuit operable to store the identified pattern; and
wherein the modification circuit is operable to modify soft decisions of the detected output to yield the modified version of the detected output based at least in part on a match between the hard decisions of the detected output and the identified pattern.

19. The storage device of claim 18, wherein the decode input is selectable between the detected output, and a modified version of the detected output.

20. The storage device of claim 17, wherein the modification circuit comprises:
a comparator circuit configured to compare hard decisions of the detected output with an identified pattern.

* * * * *